United States Patent
O'Sullivan et al.

(10) Patent No.: US 10,277,220 B2
(45) Date of Patent: Apr. 30, 2019

(54) HOT SWAP CIRCUIT MANAGEMENT TECHNIQUES FOR POWER LINE DISTURBANCES AND FAULTS

(71) Applicant: Analog Devices Global, Hamilton (BM)

(72) Inventors: Marcus O'Sullivan, Limerick (IE); Aldo Togneri, Midlothian (GB)

(73) Assignee: Analog Devices Global, Hamilton (BM)

( * ) Notice: Subject to any disclaimer, the term of this patent is extended or adjusted under 35 U.S.C. 154(b) by 269 days.

(21) Appl. No.: 15/012,574

(22) Filed: Feb. 1, 2016

(65) Prior Publication Data
US 2017/0126222 A1    May 4, 2017

Related U.S. Application Data

(60) Provisional application No. 62/250,237, filed on Nov. 3, 2015.

(51) Int. Cl.
*H03K 17/0812*    (2006.01)
*H03K 17/082*    (2006.01)

(52) U.S. Cl.
CPC ... *H03K 17/08122* (2013.01); *H03K 17/0822* (2013.01)

(58) Field of Classification Search
CPC .................. H03K 17/08122; H03K 17/0822
See application file for complete search history.

(56) References Cited

U.S. PATENT DOCUMENTS

| | | | |
|---|---|---|---|
| 5,747,955 | A | 5/1998 | Rotunda et al. |
| 5,867,379 | A | 2/1999 | Maksimovic et al. |
| 6,236,582 | B1 | 5/2001 | Jalaleddine |
| 6,320,283 | B1 * | 11/2001 | Salim ............ H02H 3/087 307/125 |
| 6,466,422 | B2 | 10/2002 | Luo |

(Continued)

FOREIGN PATENT DOCUMENTS

| CN | 104597310 A | 5/2015 |
|---|---|---|
| CN | 106655093 A | 5/2017 |

(Continued)

OTHER PUBLICATIONS

Marcus O'sullivan, "understanding hot swap: example of Hot-swap circuit design process," May 2008, Analog Dialogue 42-05, pp. 1-5.*

(Continued)

*Primary Examiner* — Thienvu V Tran
*Assistant Examiner* — Pinping Sun
(74) *Attorney, Agent, or Firm* — Schwegman Lundberg & Woessner, P.A.

(57) ABSTRACT

A device for controlling an electronic switch between a power supply and a load includes a sensing circuit to measure a current to the load and a control circuit to control operation of the electronic switch if the current exceeds a current limit. The control circuit includes a normal current circuit to output a first switch control current to the electronic switch and a boost current circuit to output a second switch control current to the electronic switch, the first switch control current being higher than the second switch control current.

22 Claims, 8 Drawing Sheets

(56) References Cited

U.S. PATENT DOCUMENTS

| | | | |
|---|---|---|---|
| 7,760,479 B2* | 7/2010 | Garrett | H03K 17/0822 361/78 |
| 7,848,117 B2 | 12/2010 | Reinberger et al. | |
| 8,064,180 B1 | 11/2011 | Sherwin | |
| 8,203,377 B2* | 6/2012 | Kelley | H03K 17/04123 326/21 |
| 8,299,767 B1 | 10/2012 | Tuozzolo et al. | |
| 8,619,440 B2* | 12/2013 | Huang | H02M 3/33523 363/127 |
| 8,680,893 B2 | 3/2014 | Spalding, Jr. et al. | |
| 2005/0185353 A1* | 8/2005 | Rasmussen | H02M 1/44 361/93.9 |
| 2006/0087787 A1* | 4/2006 | Beyler | F02P 3/053 361/100 |
| 2008/0285197 A1* | 11/2008 | Nakamura | H02H 3/087 361/93.8 |
| 2009/0256616 A1 | 10/2009 | Garrett | |
| 2010/0194451 A1* | 8/2010 | Nuutinen | H03K 17/0828 327/109 |
| 2011/0267728 A1* | 11/2011 | Guillot | H03K 17/0822 361/87 |
| 2012/0098517 A1* | 4/2012 | Esumi | H03K 17/0822 323/311 |
| 2012/0313687 A1* | 12/2012 | Togneri | H03K 17/0822 327/404 |
| 2016/0329702 A1* | 11/2016 | Sun | H02H 9/004 |
| 2017/0126226 A1* | 5/2017 | Englekirk | H03K 17/6871 |

FOREIGN PATENT DOCUMENTS

| | | |
|---|---|---|
| TW | 201034359 A | 9/2010 |
| TW | 201530154 A | 8/2015 |
| TW | 201722013 A | 6/2017 |

OTHER PUBLICATIONS

"Taiwanese Application Serial No. 105135715, Office Action dated Jun. 20, 2017", With English Translation, 8 pgs.

"Full-Feature—48 V Hot Swap Controller", ADM1073 Data Sheet, (c) 2004-2013 Analog Devices, Inc., (2004-2013), 24 pgs.

O'Sullivan, Marcus, "Understanding Hot Swap: Example of Hot-Swap Circuit Design Process", Analog Dialogue 42-05, [Online]. Retrieved from the Internet: <URL: www.analog.com/analogdialogue, (May 2008), 1-5.

"Taiwanese Application Serial No. 105135715, Response filed Aug. 21, 2017 to Office Action dated Jun. 20, 2017", 61 pgs.

"Chinese Application Serial No. 201611205091.8, Office Action dated May 24, 2018", w/o English Translation, 5 pgs.

"Chinese Application Serial No. 201611205091.8, Office Action dated Jan. 3, 2019", w/ English Translation, 7 pgs.

* cited by examiner

HOT SWAP CIRCUIT MANAGEMENT TECHNIQUES FOR POWER LINE DISTURBANCES AND FAULTS

CLAIM OF PRIORITY

This application claims the benefit of priority of U.S. Provisional Patent Application Ser. No. 62/250,237, titled "DEVICE PROTECTION USING SAFE OPERATING AREA" to Aldo Togneri et al. and filed on Nov. 3, 2015, which is herein incorporated by reference in its entirety.

TECHNICAL FIELD

This disclosure relates generally to a connection device for enabling power to be supplied to an electrical load.

BACKGROUND

There are instances when it is desired to connect an electrical load to a power supply that is already on. This can give rise to large in-rush currents as capacitive components of the load charge up. Such capacitive components may be real or parasitic components.

These in-rush currents can perturb the operation of the power supply, possibly causing protective measures within the power supply to trip. Furthermore, the in-rush currents may introduce perturbations in the power supplied to other loads connected to the power supply, and these perturbations may affect the operation of those circuits. In addition, if the newly introduced load is faulty, its fault may also affect the operation of the power supply and the other loads or circuits connected to the supply.

In order to address these issues, it is known to provide "hot swap" circuits that regulate the current flow to a load that is newly introduced to a power supply.

Overview

In some examples, this disclosure is directed to a device for controlling an electronic switch between a power supply and a load. The device comprises a first device pin configured to be connected to the electronic switch, a sensing circuit configured to measure a current to the load, and a control circuit in communication with the sensing circuit and the electronic switch, the control circuit configured to control operation of the electronic switch if the current exceeds a current limit. The control circuit includes a normal current circuit configured to output a first switch control current to the electronic switch, and a boost current circuit configured to output a second switch control current to the electronic switch, the first switch control current being higher than the second switch control current, where the control circuit is configured to, after disabling the electronic switch in response to the current exceeding the current limit: enable the boost current circuit to output the second switch control current to the electronic switch, and where the control circuit is configured to, after enabling the boost current circuit: disable the boost current circuit, and enable the normal current circuit to output the first switch control current to the electronic switch.

In some examples, this disclosure is directed to a method for controlling an electronic switch between a power supply and a load. The method comprises measuring a current to the load, disabling the electronic switch in response to a current exceeding a current limit, enabling a boost current circuit to output a first switch control current to the electronic switch, disabling the boost current circuit, and enabling a normal current circuit to output a second switch control current to the electronic switch, wherein the first switch control current is higher than the second switch control current.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
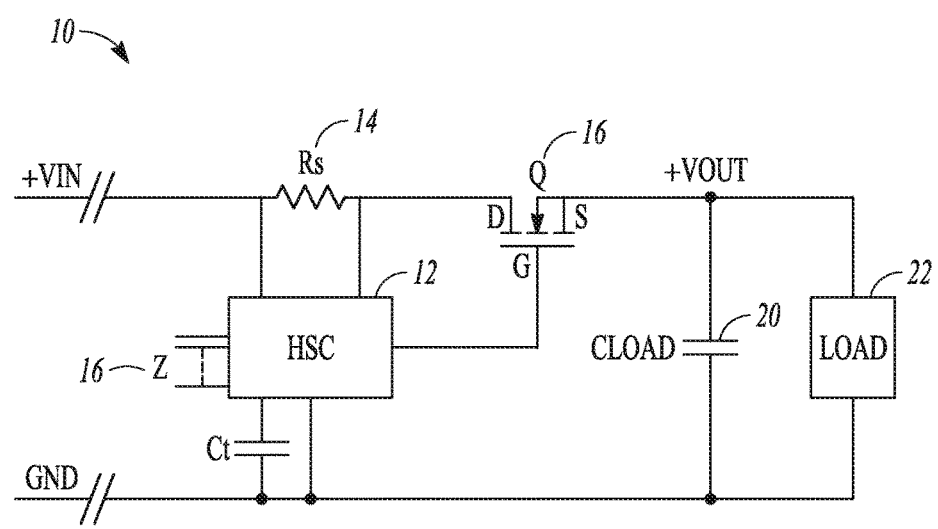
FIG. 1 is an example of an existing hot swap circuit.

FIG. 1 is an example of a block diagram of an existing hot swap circuit. A hot swap circuit 10 can include a hot swap controller 12 (HSC), a current sense element 14 ($R_S$), an electronic switch 16 (Q), e.g., MOSFET, along with a number of discrete components 18 (Z).

The main function of the hot swap controller 12 can be to detect the current in the sense element 14 and control the electronic switch 16 to ensure that the current does not exceed the system limits and/or the safe operating limits of the switch. The latter is typically achieved using a timer function that limits the amount of time the system can remain in current limit. At the output of the hot swap circuit 10, there is usually a significant amount of load capacitance 20 (CLOAD).

The controller 12 can apply a control signal to the electronic switch 16, e.g., to a gate of the FET 16, in order to enable current flow to the load 22. The controller 12 can monitor the voltage occurring across the current sensing resistor 14 and, in a closed loop, can control the electronic switch 16, e.g., the gate voltage of the FET 16, such that the rate of change of current (dI/dt) is controlled to a target value, the magnitude of the current is controlled to a target value, or the output voltage ramp is controlled to a target value. This can prevent excessive in-rush currents being drawn by the load 22. The load 22 can be assumed to be fully powered when it is no longer possible to get the rate of current increase or the current to attain the target value.

The hot swap circuit 10 generally resides on a point of power entry to a system. Its primary function is to protect the power source, hardware components (PCB, FETs, etc.) and the entire system from damage and disturbance during fault conditions. Some of the primary protection functions can include controlling power-ups e.g., limiting inrush current, detecting over current events and interrupting them, and controlling the dV/dt of the output voltage ramp.

There are typically two relevant current limits: the normal current limit is generally referred to as a circuit breaker (ILIM) and there is also a fast acting higher current limit referred to as Severe Over Current (ISOC). If the current exceeds the main current limit (ILIM) the timer function can run and typically latch off the electronic switch, e.g., MOSFET, FET, etc. once expired. If the over current happens very suddenly with large current demand, such as a low impedance short circuit, the fast acting threshold at the higher current limit threshold (ISOC) can trigger an immediate shutdown of the electronic switch, e.g., MOSFET, FET, etc. However, this function is usually not latched and can be followed by a recovery attempt. This can allow a system to regain control of the load current and attempt a recovery. If the fault is still present it can then reach a current limit and timeout accordingly, thereby shutting down the electronic switch, e.g., MOSFET. However, if the fault is no longer present, then the system may recover and power back up if conditions allow.

Hot swap controllers are usually designed to protect from faults, etc. at the load side of the circuit (output). However, systems can also experience power line disturbances (input). Examples of such disturbances can include voltage steps on the main power line, transient voltage glitches, and surges. When a typical hot swap circuit is subjected to these disturbances, the sudden increase in input supply voltage can result in a large inrush current into the load capacitance 20 (CLOAD). This current can attempt to flow through the sense element 14 and the electronic switch 16, e.g., metal-oxide-semiconductor field-effect transistor or "MOSFET". However, due to the fast slew rate of the input voltage ramp, this inrush event can present as a Severe Over Current (ISOC) fault and force the HSC to shut down the electronic switch immediately.

Next, the hot swap controller 12 can attempt to recover by once again ramping up a control signal to the electronic switch 16, e.g., ramping up the gate voltage to a MOSFET, to re-enable the supply current to the load 22. At this point, there can be a system load still demanding current in normal operation, but the electronic switch 16 is disabled. So, the energy to keep the system powered is being drained from CLOAD. The system can try to recover the supply voltage as fast as possible to prevent the voltage on CLOAD from falling below the operating voltage of the system. However, many systems use MOSFETS that are driven from the hot swap controller 12 using a high impedance driver, which can often take too long to recover the gate voltage sufficiently to allow conduction in the MOSFET. If this is allowed to happen, then the system can reset, which can be undesirable.

Four particular stages in the hot swap controller management of the power line disturbance or fault event can contribute to the recovery problem. These four stages are described below with respect to FIG. 2. A system reset could potentially occur during any one of stages 2-4.

Figure 2:
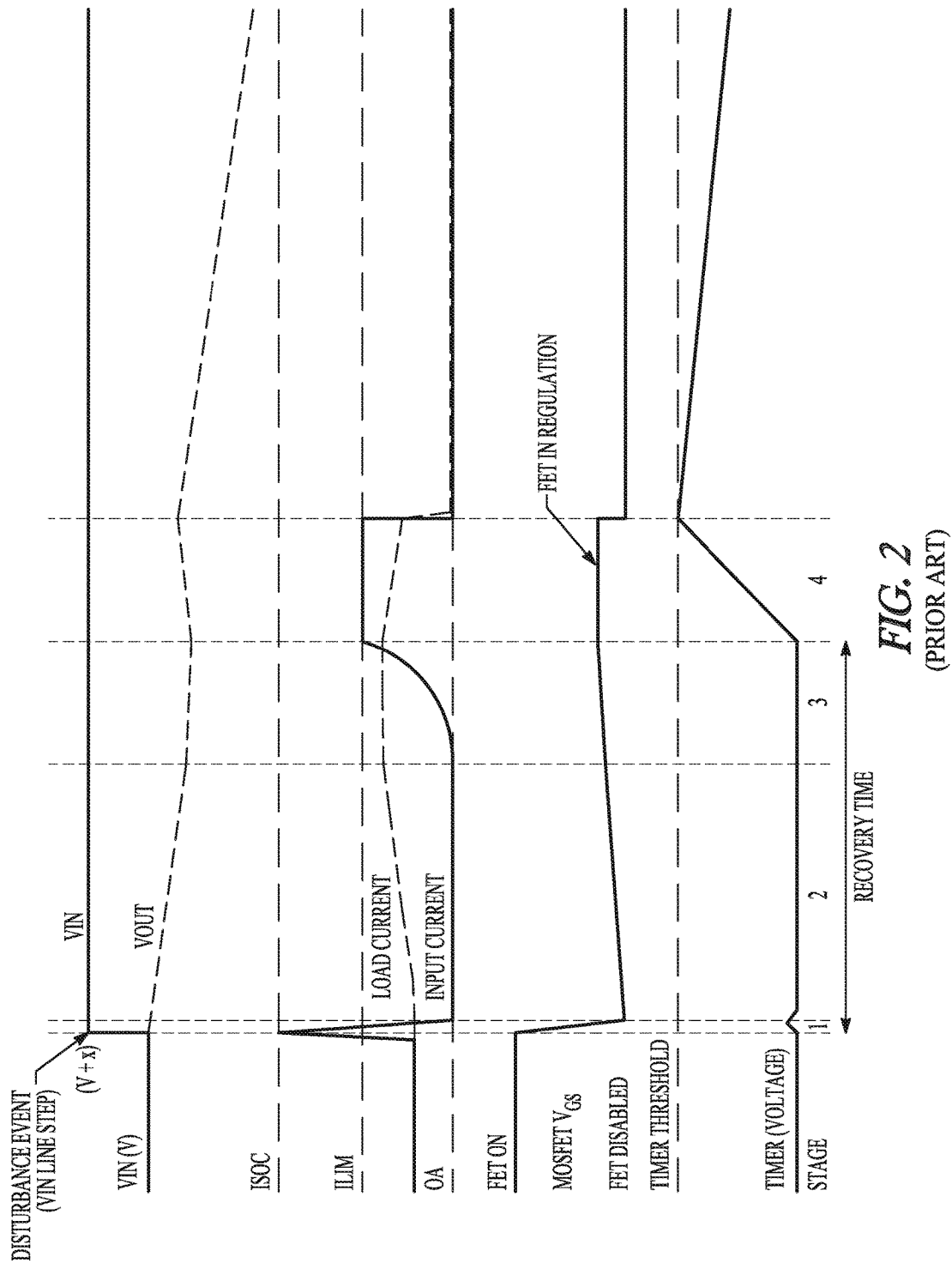
FIG. 2 is a graph depicting a power line disturbance and response using traditional hot swap controller systems.

FIG. 2 is a graph depicting a power line disturbance and response using traditional hot swap controller systems. Stage 1 can include severe over current (SOC) detection and interruption. When a disturbance occurs, the inrush current can increase rapidly and trip the SOC of the hot swap controller 12, which can result in the MOSFET gate being discharged rapidly and therefore disabling the MOSFET. This can eliminate the high current demand to the load 22 and the energy can be absorbed by external protection circuits at the input line. However, the load 22 can still be demanding load current. Therefore the hot swap controller needs to recover its input supply before CLOAD is sufficiently depleted to result in a system reset.

Stage 2 can include re-establishing conduction through the electronic switch, e.g., 0 amps to minimum current flow. Following the shutdown of the MOSFET ("FET disabled"), the hot swap controller 12 can immediately try to ramp the gate voltage back up. Typically, MOSFETs can be driven from the hot swap controller 12 using a high impedance trans-conductance amplifier output, usually sourcing in the order of tens of microamps, e.g., 25 microamps. The gate of the MOSFET can have parasitic capacitance and, in some cases, additional external capacitance can be added to control output voltage slew rates.

The MOSFET VGS threshold (VTH) can determine when current will flow in the MOSFET. Using this information, the time it will take for the MOSFET to once again begin to conduct current can be determined by $t=C\cdot V/I$, where C=total Cgate, V=VTH, I=Igate (25 uA). Using typical circuit components, this time is generally in milliseconds, which can generally results in a reset. During this period of time before the electronic switch, e.g., MOSFET, is re-enabled, CLOAD supplies the load current. This results in VOUT falling. Since VOUT often feeds power converter devices, the load current demand may increase with decreasing VOUT, which can make a fast recovery even more desirable. It is often possible that a system may reset in stage 2 alone due to VOUT undervoltage.

Stage 3 can include increasing conduction to the current limit, e.g., minimum current flow to the current limit. Assuming the MOSFET gate voltage reaches VTH and that current begins to flow through the MOSFET, the hot swap controller 12 can continue to drive the gate further to allow the current to reach the current limit. With the load still demanding current, the output can begin recovering if the current allowed pass through the MOSFET exceeds the load demand. This is a valid assumption because the current limit (ILIM) would typically be greater than the maximum expected load current. The continued gate ramp can also inhibited by any extra external capacitance on the MOSFET gate node. This can result in unnecessarily slowing down the gate voltage transition that can be needed to provide enough trans-conductance for the drain current in the MOSFET to reach the current limit.

Stage 4 can include running the electronic switch, e.g., MOSFET, at its current limit while VOUT recovers, e.g., input current=current limit=I_CLOAD+I_LOAD. In Stage 4, the goal is to recover the output voltage while operating the MOSFET in linear mode as it regulates the current at the limit. While in this mode, the system at the output can continue to demand the current I_LOAD. In fully loaded configurations, there can be a smaller percentage of current limit available to recover voltage at CLOAD to the current supply voltage. The TIMER function can be designed to limit the time the MOSFET remains in current limit, to protect the safe operating area (SOA) of the MOSFET. This is usually set to a time representative of the worst case fault conditions and the MOSFET SOA limitations. This can mean that the time available to recover the output voltage can also limited to this maximum fault timer. This can result in a system shutdown if the duration of inrush current is greater than the hot swap controller 12 fault timer will allow.

The present inventors have determined that a solution to this recovery problem can include providing a significantly higher switch control current, e.g., gate drive current, for a short period of time to boost the voltage, e.g., gate voltage, up to a threshold voltage ($V_{th}$) of the switch to begin conduction through the electronic switch, e.g., MOSFET. It should be noted that the terms MOSFET and FET are used interchangeably throughout this disclosure. The techniques of this disclosure are not limited to MOSFETs and FETs, however. The techniques described in this disclosure can be used with other electronic switches, including other transistors.

Using various techniques of this disclosure and as described in detail below, the hot swap controller can, among other things, include a boost current circuit that can be enabled after the hot swap controller has disabled the electronic switch in response to a current exceeding a current limit, which can allow the voltage at the electronic switch, e.g., gate voltage, to ramp up at a much faster rate. After a criterion is met, e.g., detecting a voltage exceeding a preset voltage and/or determining that a time exceeded a preset time, the boost current circuit can be disabled and a normal current circuit can be enabled to source switch control current to the electronic switch. Using these techniques, the delay in recovery time can be significantly reduced, e.g., reduced from a delay of 2 milliseconds to a delay of 50 microsecond. A solution to the recovery problem is described below with respect to FIGS. 3 and 4.

Figure 3:
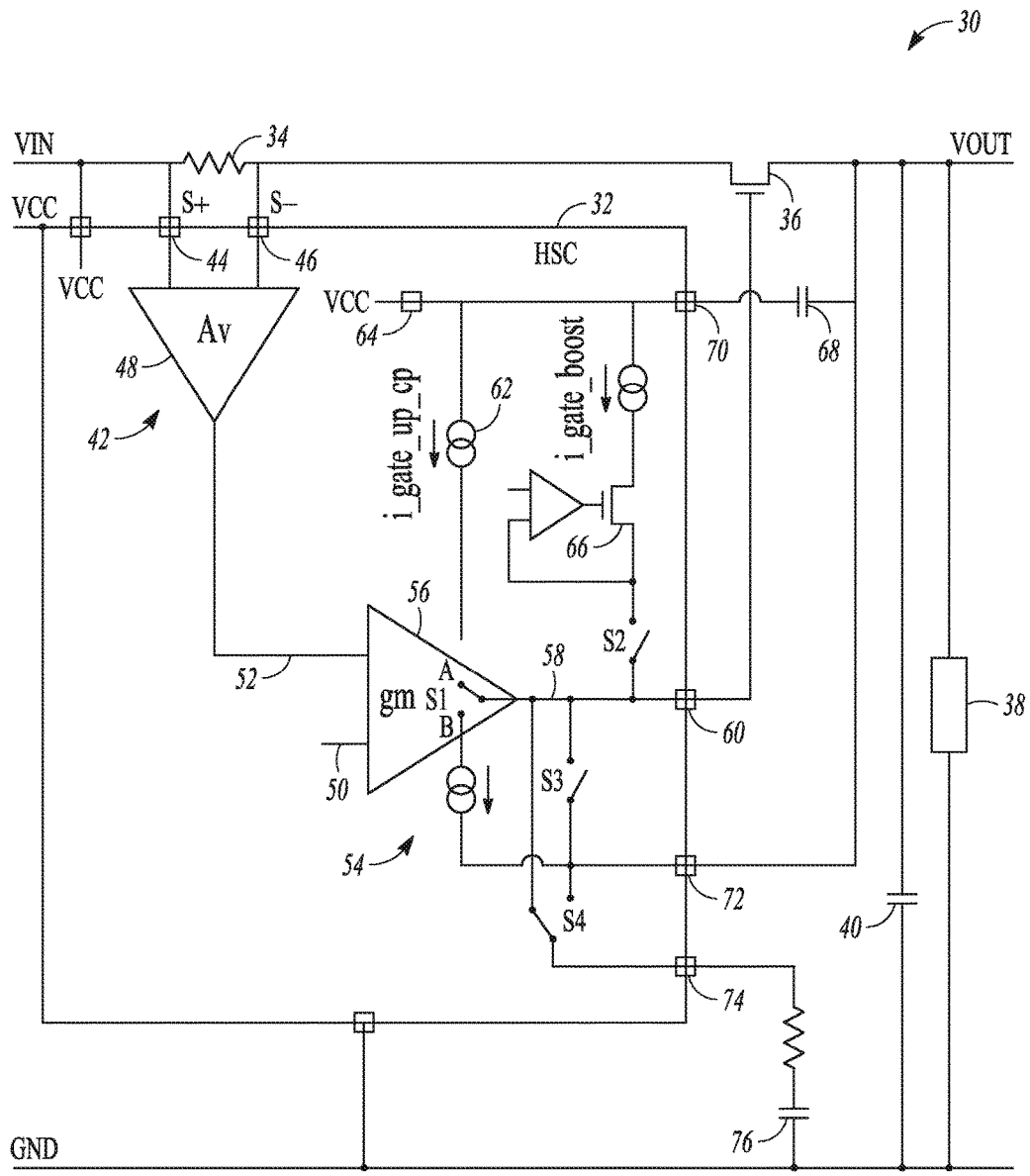
FIG. 3 is an example of a block diagram of a hot swap controller, in accordance with this disclosure.

FIG. 3 is an example of a block diagram of an example of a hot swap controller for controlling an electronic switch between a power supply and a load, in accordance with various techniques of this disclosure. The hot swap circuit 30 of FIG. 3 can include a hot swap controller 32 (or device 32), a current sense element 34, an electronic switch 36, e.g., MOSFET, connected to a load 38. At the output of the hot swap circuit 30, there is usually a significant amount of load capacitance 40.

The device 32 can include a sensing circuit 42 configured to measure a current to the load 38, based on the voltage drop across the current sense element 34, which is received via device pins 44, 46 (S+ and S−). The sense voltage across the current sense element 34 can be amplified using voltage amplifier 48. Along with a reference voltage 50 (VREF), the amplified sense voltage 52 can be inputted into a control circuit 54 that can include an amplifier 56, e.g., transconductance (gm) amplifier. An output 58 of the amplifier 56 can be connected to a device pin 60, which can be connected to the electronic switch 36, e.g., to a gate of a MOSFET. The amplifier 56 can regulate the gate voltage of the MOSFET using the voltage measured across the current sense element 34. In this manner, the control circuit 54, which is in communication with the sensing circuit 42 and the electronic switch 36, can be configured to control operation of the electronic switch 36 if the current exceeds a current limit.

The control circuit 54 can include a normal current circuit 62 configured to output a first switch control current, e.g., gate control current, to the electronic switch 36. The normal current circuit 62 can include a charge pump circuit 64 that can deliver a first current (shown as "i_gate_up_cp" in FIG. 3) to the electronic switch 36, e.g., to a gate of a MOSFET, via a device pin 60.

As mentioned above, the present inventors have determined that a solution to the recovery problem can include providing a boost current circuit 66 that can be enabled after the hot swap controller 32 has disabled the electronic switch 36 in response to a current exceeding a current limit, which can allow the voltage at the electronic switch 36, e.g., gate voltage, to ramp up at a much faster rate. The boost current circuit 66 can include a linear ramp generator that, in some examples, can be current limited (shown as "i_gate_boost" in FIG. 3). In an example implementation, the ramp can be set at about 0.5 volts/microsecond. The boost current circuit 66 can deliver a second current that can be higher than the first current of the normal current circuit to the electronic switch 36, e.g., to a gate of a MOSFET, via the device pin 60.

In an example implementation, the boost current circuit 66 can be connected to a storage or reservoir capacitor 68, e.g., about 1 microfarad, via a device pin 70, or in some examples, internally connected. The storage capacitor 68 can supply the boost current to the electronic switch 36.

In operation, the control circuit 54, after disabling the electronic switch 36 in response to the current measured by the sensing circuit 42 exceeding a current limit, can enable the boost current circuit 66 to output a boost control current to the electronic switch 36, e.g., to the gate of the MOSFET via device pin 60. Then, after one or more criteria are met, the control circuit 54 can disable the boost current circuit 66 and enable the normal current circuit 62 to source a lower switch control current to the electronic switch.

Example criteria include detecting a voltage exceeding a preset voltage at the electronic switch, detecting that current has started to flow through the sensing element 34, and/or determining that a time exceeded a preset time to allow the electronic switch to begin conducting. Using these techniques, the delay in recovery time can be significantly reduced, e.g., reduced from a delay of 2 milliseconds to a delay of 50 microsecond. Additionally details of the operation of the hot swap controller 32 are described below with respect to FIG. 4.

In some example implementations, the control circuit 54 can include a plurality of switches S1-S4. In an example configuration, the switches S1-S4 can be switch drivers. As seen in FIG. 3, switch S1 can toggle between positions S1A and S2B. Switch S1 can connect the normal current circuit 62 to the device pin 60 (connected to the electronic switch 36) when in position S1A, e.g., source current of 25 microamps, and disconnect the normal current circuit 62 from the device pin 60 when in position S1B, e.g., sink current of 50 microamps. Switch S2 can connect the boost current circuit 66 to the device pin 60 (connected to the electronic switch 36).

After disabling the electronic switch 36 in response to the current exceeding the current limit, the control circuit 54 can output a first signal to control the switch S2 to connect the boost current circuit 66 to the device pin 60 and to control the switch S1 to disconnect the normal current circuit 62 from the first device pin 60. Then, after one or more criteria are met after enabling the boost current circuit, the control circuit can output a second signal to control the switch S2 to open and to control the switch S1 to close, thereby disabling the boost current circuit 66 and enabling the normal current circuit 62.

The control circuit 54 can include switch S3 that can connect, for example, the device pin 60 connected to the gate of the electronic switch 36 to the device pin 72 connected to VOUT. The switch S3 can be a main off switch, which can allow the voltage on the electronic switch 36, e.g., the voltage on the gate of the MOSFET, to quickly discharge and disable the electronic switch 36.

Hot swap controllers can include a device pin configured to be connected to one or more external components that include a capacitance 76 configured to set a voltage ramp time (dV/dt), at the electronic switch 36. In existing designs, the dV/dt capacitance can be connected to device pin 60 connected to the electronic switch 36, e.g., the gate of the MOSFET.

The present inventors have recognized that the dV/dt capacitance 76 connected to the gate of the MOSFET can contribute directly to the time that it takes for the gate to recover. The present inventors have determined that a solution can include adding a separate device pin 74 to which the dV/dt capacitance 76 can be connected and include a switch S4 that can connect the dV/dt capacitance 76 to the device pin 60, which can be connected at startup to the electronic switch 36, e.g., the gate of the MOSFET, and switch the dV/dt capacitance to the device pin 72, which can be connected at startup to VOUT before recovery (stage 3 as described below with respect to FIG. 4). The control circuit 54 can thus disconnect the dV/dt capacitance 76 from the gate of the MOSFET when not required and eliminate unnecessary delays.

Figure 4:
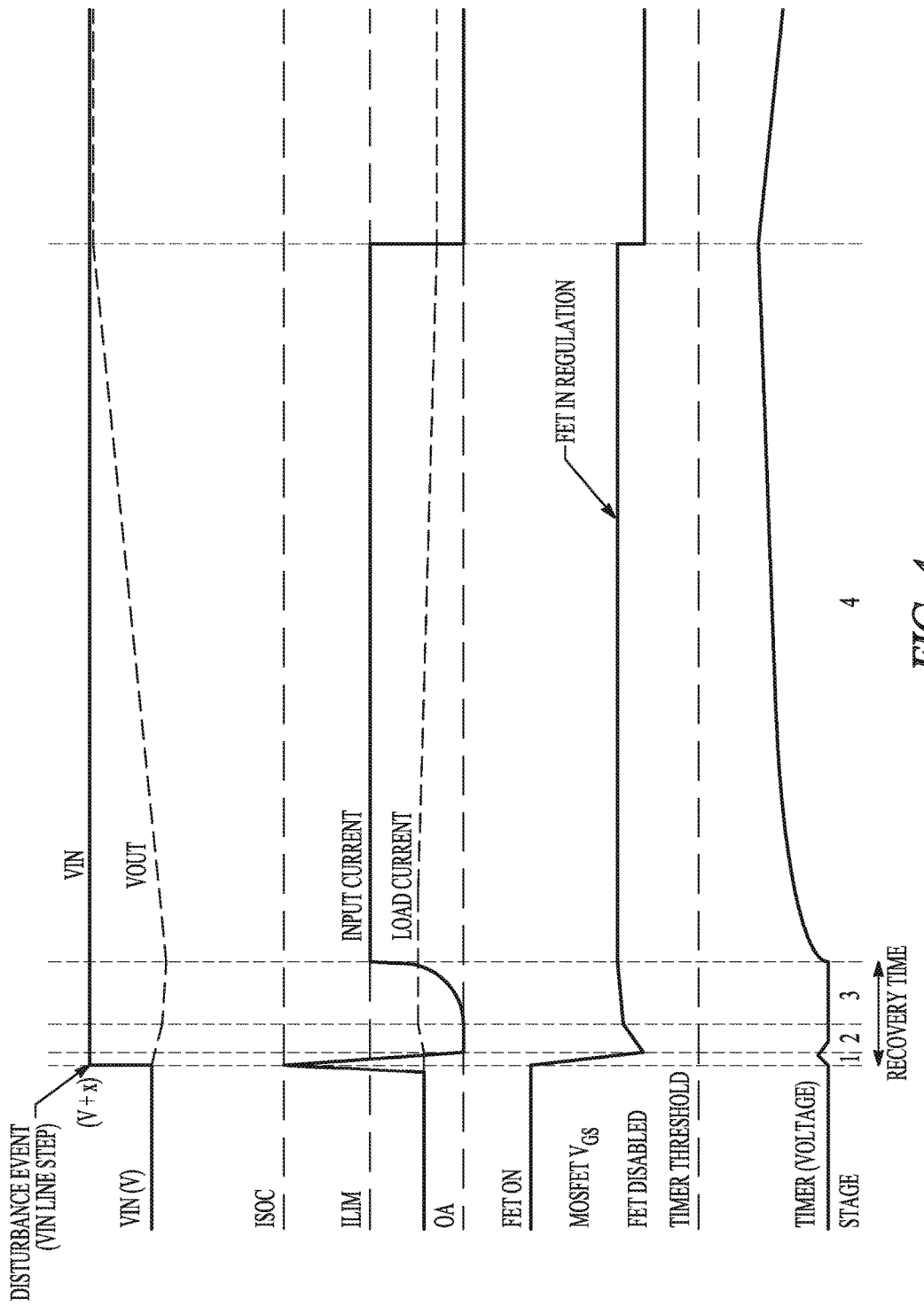
FIG. 4 is a graph depicting a power line disturbance and response using solutions described in this disclosure.

FIG. 4 is a graph depicting a power line disturbance and response using solutions described in this disclosure. FIG. 4 will be described with respect to the circuit of FIG. 3.

Stage 1 of FIG. 4 is similar to Stage 1 of FIG. 2 and, for purposes of conciseness, will not be described in detail again. Briefly, Stage 1 can include severe over current (SOC) detection and interruption.

Stage 2 can include re-establishing conduction in the electronic switch 36, e.g., 0 amps (A) to minimum current flow. Since the electronic switch 36, e.g., MOSFET, can generally be driven from the hot swap controller 32 using a high impedance driver, this can simply take too long to recover the gate voltage sufficiently to allow conduction in the MOSFET.

As described above with respect to FIG. 3, the present inventors have determined that a solution is to provide a significantly higher switch control current, e.g., gate drive current (i_gate_boost), for a short period of time to boost the gate voltage up to Vth. After an SOC shutdown event, the boost current circuit 66 of FIG. 3 can be enabled (e.g., close switch S2 and enable ramp generator circuit), allowing the gate voltage to ramp up at a much faster rate set by a specific ramp reference. In some example implementations, the boost current circuit 66 can have a current limit associated with it for protection reasons.

When the sensing circuit 42 measures some current flow as detected by reference Vref, the control circuit 54 can be determine that the electronic switch 36, e.g., MOSFET, is once again beginning to conduct, at which point the control circuit 54 can disable the boost current circuit 66 (e.g., open S2) and the switch control current, e.g., gate drive current, can return to normal levels (i_gate_up_cp). Utilizing a boost current circuit can result in a reduction of the delay in this mode (0 A to min current flow). The inventors have found that a typical example of improvement is a delay of 2 milliseconds reduced to a delay of 50 microseconds. Taking an example of CLOAD=1 mF, the load current (Iload)=20 A, that improvement in delay can be the difference between a 40 V VOUT dip versus a 1 V VOUT dip, where the 40 V dip would almost certainly cause a system reset.

Stage 3 can include increasing conduction to the current limit, e.g., minimum current flow to the current limit). Since the capacitance on the gate of the MOSFET can contribute directly to the time it takes the gate to ramp, a solution can include adding the capacitance used for startup (dV/dt capacitance) to another pin so the hot swap controller can disconnect this capacitive load (via switch S4 of FIG. 3) from the gate when not required. This can eliminate any unnecessary delay in recovery due to large additional gate capacitors.

Stage 4 can include running at the current limit while VOUT is recovering. A solution can include using a scheme that allows the on-time to be dynamically controlled and defined by the MOSFET Vds of the live system. An example of such a solution is shown and described below with respect to FIG. 5.

In an example, the worst case short circuit can then limit the on-time (or energy) to a much smaller time than a line step with perhaps a 5V Vds differential. An example implementation can use a trans-conductance amplifier across the FET Vds, with a given gain, feeding an output current driven on a new timer function pin, labeled as E_SOA in FIG. 4. A component network can be placed on this pin to allow the voltage on this pin to model the MOSFET junction temperature. So with a low VDS fault, if the SOA dictates, the on-time can be significantly longer than if the VDS was very high. Another implementation may involve a digital mapping of the MOSFET SOA, so that the hot swap controller 32 can determine the required on-time (or energy level) for given fault conditions.

A problem with running at the current limit during while VOUT is recovering is that a large amount of power may be dissipated in the MOSFET 36 during the in-rush control period. To put this in context, it can be seen that when the load is fully powered, although the currents flowing through the MOSFET 36 may be quite high, the voltage across the MOSFET 36 is very small. Thus the amount of energy dissipated in the MOSFET 36 is quite low. In fact, for modern switching field-effect transistors the drain-to-source on resistance may be in the order of just a few milliohms. Consequently, the power dissipation as given by $I^2R$ remains low. Similarly, it can be seen that if the transistor was fully off then although the voltage across the transistor might be quite high, the current through it would be zero and consequently there would be no dissipation. However, during the period when the transistor is performing in-rush current limiting, the currents through the MOSFET 36 may be quite high, and the voltage across the transistor may be quite significant. Under such circumstances, the power dissipation within the transistor may be sufficiently high to warm the device such that it becomes thermally stressed. Thermal stressing is a product of the amount of power being dissipated in the transistor and the time for which that power is dissipated.

Electronic power devices, such as power FETs, have several operating characteristics that define their operational parameters. One such characteristic that is normally published by the transistor manufacturer is its safe operating area. Transistors, such as FETs, can be damaged if they are exposed to stresses beyond their safe operating area (SOA). The SOA can define multiple regions, e.g., two SOA regions, such as an absolute maximum voltage and current that the device can withstand, and also a "linear" region where the combination of voltage, current and pulse time beyond which damage can occur. The predominant failure mechanism in the linear SOA region is overheating. Examples of safe operating area characteristics are shown in FIGS. 2 and 3 of U.S. Patent Application Publication No. 2012/0313687 to Togneri et al., the entire content of which being incorporated herein by reference.

Existing hot swap controllers can include a user programmable timer that runs when the FET current control loop is running and turns the FET off if the timer runs out. However, these existing designs often do not monitor the drain-tosource voltage of the FET and thus may not use the SOA of the FET effectively. However, using the techniques of this disclosure, the drain-to-source voltage of the FET can be monitored at one of two different known constant current levels, e.g., startup mode current level and post-startup current level, thereby allowing the controller to use the SOA of the FET more effectively.

As described in detail below, various techniques described in this disclosure can predict the device temperature by using a thermal model of the device, e.g., power FET, and driving this model with the actual electrical stresses that the device is experiencing. The device temperature can be extracted from the model and used to modulate the device's operating conditions to prevent damage. The FET power can be modeled as a pin current and the FET temperature can be modeled as a pin voltage. The FET thermal characteristics can be modeled by a component network, e.g., an external component network, connected to the pin. In this manner, a predicted internal temperature can be used to protect the device rather than some other specific operating condition.

Figure 5:
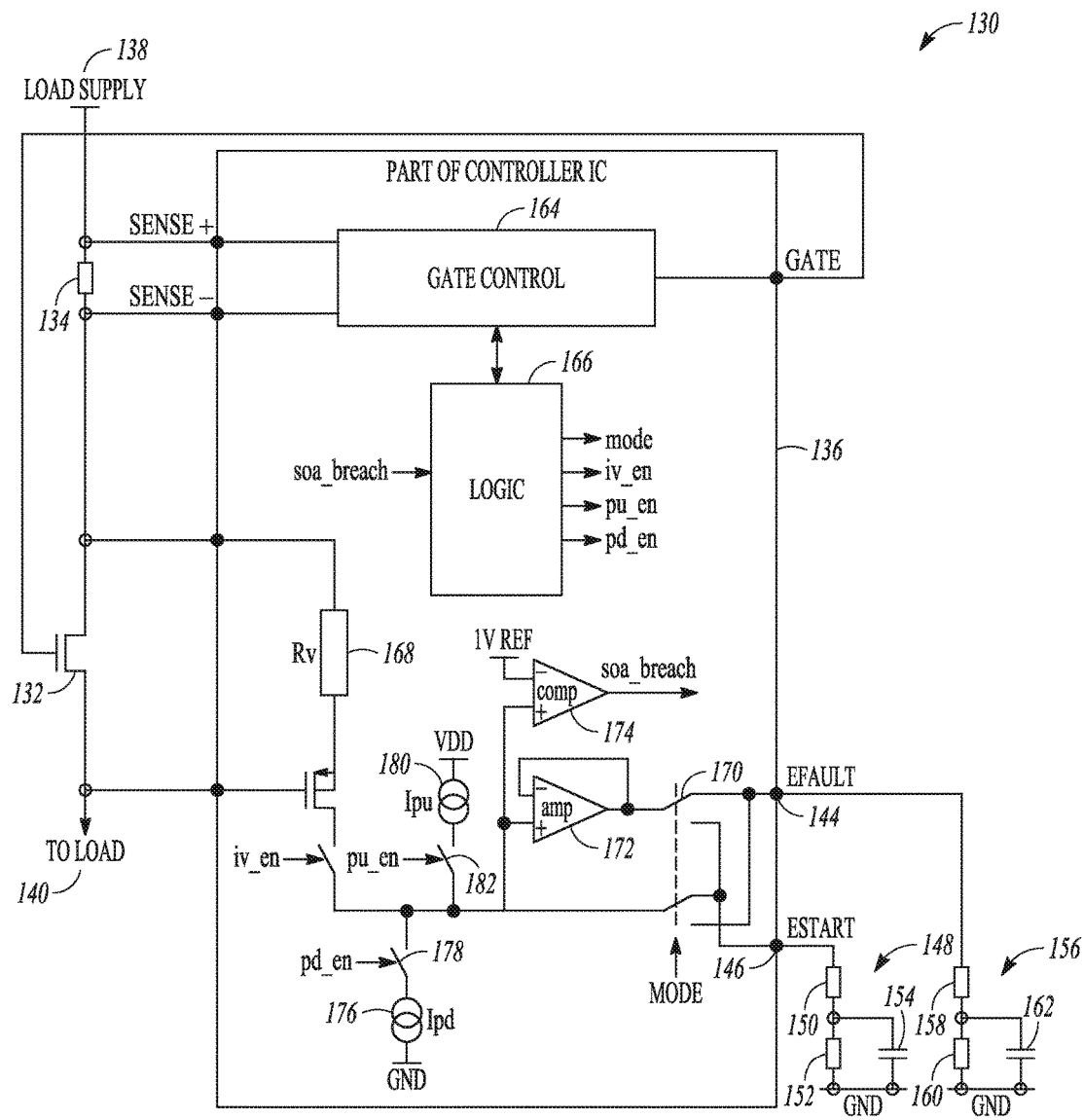
FIG. 5 is another example of a hot swap controller block diagram, in accordance with this disclosure.

FIG. 5 is another example of a block diagram of a hot swap circuit, in accordance with various techniques of this disclosure. It should be noted that, as mentioned above, in some example implementations, the hot swap controller 32 of FIG. 3 can include some or all of the various features shown and described with respect to FIG. 5. To prevent confusion and for purposes of clarity, however, the features of FIGS. 3 and 5 are presented and described separately. The various techniques described with respect to FIGS. 3 and 5 can, in some example configurations, be standalone features, such that a hot swap controller can include features from either FIG. 3 or FIG. 5.

The hot swap circuit 130 of FIG. 5 can connect a power supply to an electrical load, or energize an electrical load. The hot swap circuit 130 of FIG. 5 can include an electronic switch 132, such as a power-control FET (e.g., an N-channel metal-oxide-semiconductor field-effect transistor or "MOSFET") or other electrically controllable current flow device, a current-sense resistor 134, and a hot swap controller 136. The FET 132 can control the load current flowing from a power supply 138 to a load 140.

The FET 132 can be controlled by the hot swap controller 136. In particular, the hot swap controller 136 of the hot swap circuit 130 can monitor the load current by measuring a voltage drop across the current-sense resistor 134 (the "sense voltage"). The sense voltage, and therefore the load current, can be maintained below a preset maximum. As the voltage drop increases, the hot swap controller 136 can determine that the load current through the FET 132 is also increasing and control a gate control circuit 164 to adjust the gate voltage to the FET 132.

A user can select values of one or more components, e.g., resistors and capacitors, connected to a respective device pin, namely EFAULT pin 144 and ESTART pin 146. In some example configurations, the components, e.g., externally connected or internally integrated components, can form a resistor and capacitor network (or "RC network"). In some example configurations, both the EFAULT pin 144 and the ESTART pin 146 can be connected to a respective RC network. In other example configurations, the component can be a capacitor without a resistor, as described in more detail below. A current that is related to the power of FET 132 can be sourced into the EFAULT pin 144 and/or ESTART pin 146 and these components, e.g., resistors and/or capacitors, can convert this current into a voltage that is related to the temperature of FET 132.

During a startup mode, currents can be at very low levels while at fault conditions during a post-startup mode the currents can be much higher. Thus, different regions or areas of the SOA curve of the FET 132 can be of interest during the startup mode and the post-startup mode, e.g., normal operation. As mentioned above and in accordance with this disclosure, the external component(s), e.g., each RC network, can model the SOA curve of the FET 132 at two different user configurable current levels, namely the startup mode current level and the post-startup currently level, e.g., the normal operating mode current level. As seen in FIG. 5, the first RC network 148 can include a resistor 150, a resistor 152, and a capacitor 154, and the second RC network 156 can include a resistor 158, a resistor 160, and a capacitor 162.

In addition to configuring the current levels for startup and post-startup conditions, a designer can set different limits for the startup and post-startup, conditions by connecting the first RC network 148 (or capacitor, for example) to the ESTART pin 146 and a second RC network 156 (or capacitor, for example) to the EFAULT pin 144, where the first RC network includes a resistor and/or capacitor that has a different value than a resistor and/or capacitor of the second RC network. The first RC network 148 can approximate a first portion or region of an SOA curve (or just "SOA" in this disclosure) for the FET 132 and the second RC network 156 can approximate a second portion or region of an SOA curve (or just "SOA" in this disclosure) for the FET 132.

Two pins, namely the ESTART pin 146 and the EFAULT pin 144, can be used because the components of the first and second RC networks 148, 156 can be selected depending on the FET 132 regulation current, which can be different during the startup mode (or hot swap mode) and a post-startup mode, e.g., a normal operating mode. There can also be significantly different SOA performances at different current levels. For example, when the FET 132 is operating at a low gate-to-source voltage ("VGS"), thermal instability mechanisms, e.g., "hot spots", can significantly reduce the SOA of the FET 132. In accordance with this disclosure, the two separate RC networks 148, 156, can allow for these thermal effects.

It should be noted that in some implementations, the first and second portions of the SOA curve modelled by the RC networks 148, 156 can additionally or alternatively be digitally mapped and stored in a memory so that the hot swap controller can determine the required on-time (or energy level) for given fault conditions.

The hot swap controller 136 of FIG. 5 can generate a current that is proportional to the drain-to-source voltage ("VDS") across the FET 132 and source the current into the EFAULT/ESTART pins 144, 146, thereby controlling how much energy is allowed to be transferred into the FET 132. In this manner, the hot swap controller 136 of FIG. 5 can ensure that the FET 132 remains within the SOA limits.

While there is a significant VDS across the FET 132, its drain current ID can be held constant (based on the user configurable current level). Thus, the FET power (P=V*I) can be proportional to the VDS. The FET power can be modeled as the current sourced into the EFAULT/ESTART pins 144, 146 (which is proportional to the VDS across the FET 132), and the FET temperature is modeled as the voltage on the EFAULT/ESTART pins 144, 146, where the external components connected to the EFAULT/ESTART pins 144, 146 can model the thermal characteristics of the FET 132 during startup or normal operation. Using the techniques of this disclosure, the controller 136 can inject a current proportional to VDS into the external components, e.g., RC networks, connected to the EFAULT/ESTART pins 144, 146 and ground, and turn the FET 132 off if the voltage on either pin reaches 1 volt, for example (e.g., just before the SOA is breached). On reaching 1 volt, for example, the controller 136 can determine that the FET 132 is getting too hot and can shut the FET off.

The techniques of this disclosure are in contrast to existing techniques that attempt to model the thermal behavior of a FET, such as described in U.S. Pat. No. 8,299,767 to Tuozzolo et al. In U.S. Pat. No. 8,299,767, an instantaneous power dissipated by the FET is represented by a product of an instantaneous current and an instantaneous voltage (VDS). The techniques of this disclosure do not utilize an instantaneous current. Rather, the current can be one of two different user-configurable levels based on whether the controller 136 is in the startup mode or the normal operating mode. Based on the mode, the current proportional to the VDS can be sourced onto the active pin, e.g., EFAULT/ESTART pins 144, 146. The techniques of this disclosure can be more accurately model the thermal characteristics of the FET at lower currents, in contrast to the techniques disclosed in U.S. Pat. No. 8,299,767.

The hot swap controller 136 of FIG. 5 can operate in at least two modes: a startup mode (or hot swap mode) and a post-startup mode, e.g., a normal operating mode. A user can set both a startup mode load current value and a normal operating load current value, and store these load current values in a SOA protection circuit 166, for example. A gate control circuit 164 can determine the voltage across the sense resistor (and thus the load current), compare the load current to the values set by the user, and then control the gate voltage of the FET 132 so that the load current is approximately equal to the value set by the user. In the startup mode, the gate control circuit 164 can compare the load current to the stored startup mode load current value, and in the normal operating mode, the gate control circuit 164 can compare the load current to the stored normal operating load current value.

When power is first applied to the hot swap controller 136 of FIG. 5, the controller 136 can be in the startup mode. An SOA protection circuit 166 can monitor the VDS of FET 132 as a resistor 168 is driven to a voltage that is almost the same as the VDS of the FET. In the startup mode, the SOA protection circuit 166 can output a "mode" signal to an internal switch 170, e.g., a double-pole, double-throw switch, that can connect the resistor 168 to the ESTART pin 146 (the active pin in the startup mode) and allow the current through the resistor 168 to be applied to the ESTART pin 146 and thus to the RC network 148. The voltage on the ESTART pin 146 can increase as the current is applied and at a rate that is based on the RC time constant of the RC network 148. As described below, in one example, the current can be applied to the ESTART pin 146 when the hot swap regulation loop is near regulation.

The pin that is not being used, e.g., the EFAULT pin 144 in the startup mode or the ESTART pin 146 in the normal operating mode, can be driven to the same voltage as the active pin by an amplifier 172. The amplifier 172 can act as a buffer, e.g., a unity gain buffer amplifier, which can allow the hot swap controller 136 to "remember" how hot the FET 132 is (as the voltage on the EFAULT/ESTART pins 144, 146 is related to the surface temperature of the FET 132) when the mode switches, e.g., from startup mode to normal operating mode, as described below.

By way of example, assume a network card that includes the hot swap circuit 130 is plugged into a backplane. The hot swap controller 136 can begin in startup mode and an in-rush current can cause the surface temperature of the FET 132 to heat up. Assume that during startup only half of the SOA for the FET 132 was used and the ESTART pin 146 is driven to 0.5 volts. Then, the hot swap controller 136 can change to the normal operating mode. Without the amplifier 172, the hot swap controller 136 can switch to the normal operating mode and use the ESTART pin 144 as the active pin, which is at 0 volts. If the ESTART pin 144 were at 0 volts, however, the hot swap controller 136 can assume that the entire SOA of the FET 132 was available should a fault occur. The hot swap controller 136 may not know that the FET 132 was already at an increased temperature due to the in-rush current, which reduced the available SOA. If a fault occurred almost immediately after changing from the startup mode to the normal operating mode, the FET 132 could be damaged because the hot swap controller 136 would think that the full FET SOA was available.

However, as mentioned above, using various techniques of this disclosure, the amplifier 172 can allow the hot swap controller 136 to "remember" how hot the FET 132 was when the controller 136 switches modes, e.g., from startup mode to normal operating mode. The pin that is not being used, e.g., the EFAULT pin 144 in the startup mode, can be driven to the same voltage as the active pin by the amplifier 172. In the example above, the EFAULT pin 144 would be at 0.5 volts when the hot swap controller 136 changed from the startup mode to the normal operating mode, which would accurately reflect the thermal state of the FET 132. After changing to the normal operating mode, and assuming that no fault condition occurred, no additional current would be driven into the ESTART pin 144 and the RC network 148 would eventually discharge. Thus, the hot swap controller 136 would have the full SOA available once the FET 132 had cooled down.

Continuing with the description of the startup mode, the voltage on the ESTART pin 146 can be applied to an input of a comparator 174 that can compare the ESTART pin voltage to a voltage reference, e.g., a 1-volt reference. If the voltage on the ESTART pin 146 reaches the reference voltage, e.g., 1 volt, then the comparator can output an "soa_breach" signal to the SOA protection circuit 166. In response, to protect the FET 132 from damage, the SOA protection circuit 166 can output a signal to the gate control circuit 164 that turns the FET 132 off by turning off the gate voltage. As mentioned above, in one example, the current can be applied to the ESTART pin 146 when the hot swap regulation loop is near regulation, e.g., when the voltage on the ESTART pin 146 is near the reference voltage, e.g., 1 volt. In some example implementations, the regulation decision can be made when the sense voltage gets to within about 1 mV of the target level. As one example, the target level can be between about 10 mV and about 30 mV for the normal (or post-startup) mode and between about 2.5 mV and about 30 mV for startup mode.

While in the startup mode, until the voltage on the ESTART pin 146 reaches the reference voltage, e.g., 1 volt, the gate control circuit 164 can continue to drive the gate of the FET 132 and limit the in-rush current to the startup mode load current value, e.g., 2 amps. In this manner, the gate control circuit 164 and the SOA protection circuit 166 can form a current control loop that attempts to keep the current through the FET 132 constant while there is a significant voltage drop (VDS) across the FET 132.

As the output voltage of FET 132 gets close to the input supply voltage of the load supply 138, the VDS of the FET 132 is small, so the gate control circuit 164 can continue to increase the gate voltage to achieve the startup mode load current value, e.g., 2 amps. Eventually, the gate control circuit 164 has increased the voltage on the gate such that the gate of the FET 132 is fully enhanced, e.g., about 10 volts on the gate. The SOA protection circuit 166 can monitor the gate control circuit 164 and can determine from the applied gate voltage that the gate is fully enhanced and thus fully ON. Once the gate of the FET 132 is fully ON, the startup mode is complete. The hot swap controller 136 can output an external signal via a device pin (not depicted) to the other loads that can indicate that the power is good so that the other loads can turn on.

Once the SOA protection circuit 166 determines that the gate is fully enhanced, the hot swap controller 136 can change from the startup mode to the normal operating mode. In the normal operating mode, the SOA protection circuit 66 can output a "mode" signal to the switch 170, which can connect an output of the amplifier 172 to the ESTART pin 144. In addition, in the normal operating mode, the gate control circuit 164 can compare the load current to the stored normal operating load current value.

Like in the startup mode, the VDS of FET 132 can be monitored by driving the resistor 168 to a voltage that is almost the same as the VDS of the FET. The current through the resistor 168 is applied to the EFAULT pin 144 and thus to the RC network 156. The voltage on the EFAULT pin 144 increases as the current is applied and based on the RC time constant of the RC network 156.

The voltage on the EFAULT pin 144 is applied to an input of the comparator 174 that can compare the EFAULT pin voltage to a voltage reference, e.g., a 1-volt reference. If the voltage on the EFAULT pin 144 reaches the reference voltage, e.g., 1 volt, then the comparator 174 can output an "soa_breach" signal to the SOA protection circuit 166. In response, the SOA protection circuit 166 can output a signal to the gate control circuit 164 that turns off the FET 132 by turning off the gate voltage to protect the FET 132 from damage.

The hot swap controller 136 of FIG. 5 can also include a pull-down current source 176, e.g., a 500 nano-amp current source. If, for example, the user was not concerned with the SOA, the user may connect a capacitor to one or both of the EFAULT pin 44 and the ESTART pin 46, rather than connect RC networks 148, 156, which can closely approximate the SOA curves. By including the pull-down current source 176, a resistor is effectively built into the hot swap controller 136, thereby allowing some SOA operation. The pull-down current source 176, however, may not accurately reflect the SOA curves. The SOA protection circuit 166 can output a pull-down enable signal "pd_en" that closes a switch 78 and connects the pull-down current source 176. In some example configurations, SOA protection circuit 166 can control the auxiliary pull-down and pull-up currents using the "near regulation" state. When near regulation, the pull-up enable signal is active, and when not near regulation, the pull-down enable signal is active.

The hot swap controller 136 of FIG. 5 can also include a pull-up current source 180, e.g., a 1 micro-amp current source. When the current is near regulation, e.g., the user configured current limit, the SOA protection circuit can output a pull-up enable signal "pu_en" that closes a switch 182 and connect the pull-up current source 180. The pull-up current source 180 can perform 2 functions: 1) compensate for an error in the VDS to current conversion, and 2) can run EFAULT/ESTART pin current even if there is a very small VDS, thereby allowing the system to power down if this condition persisted for an extended time, e.g., a faulty load drawing a load current just below the user configured current limit.

Figure 6:
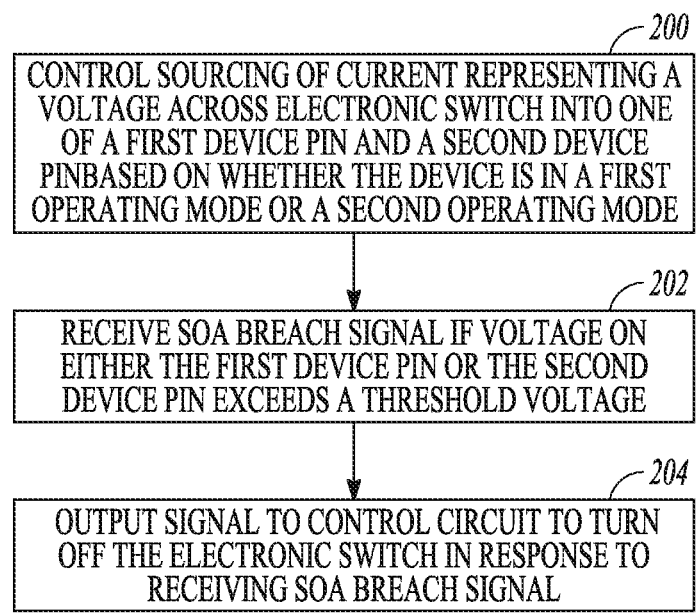
FIG. 6 is a flow diagram of an example of a method for protecting an electronic switch during operation, in accordance with this disclosure.

FIG. 6 is a flow diagram of an example of a method for protecting an electronic switch during operation, in accordance with this disclosure. A control circuit, e.g., controller 136 of FIG. 5, can control a sourcing of a current representing a voltage, e.g., a VDS, across an electronic switch, e.g., a transistor such as FET 132 of FIG. 5, into one of a first device pin of a device and a second device pin of the device (block 200). The control circuit can control the sourcing of current based on whether the device is in a first operating mode or a second operating mode, where the first operating mode has a first constant current level, e.g., a startup mode current level, through the electronic switch and the second operating mode has a second constant current level, e.g., post-startup mode current, through the electronic switch. The first device pin can be configured to be connected to at least one first external component, e.g., first RC network 148 of FIG. 5, where the at least one first external component is a model of a first region of the SOA of the electronic switch. The second device pin can be configured to be connected to at least one second external component, e.g., second RC network 156 of FIG. 5, where the at least one second external component is a model of a second region of the SOA of the electronic switch.

The control circuit can receive an SOA breach signal if a voltage on either the first device pin or the second device pin exceeds a threshold voltage (block 202). The control circuit, e.g., controller 136 of FIG. 5, can output a signal, e.g., to the gate control circuit, to turn off the electronic switch in response to receiving the SOA breach signal (block 204).

Figure 7:
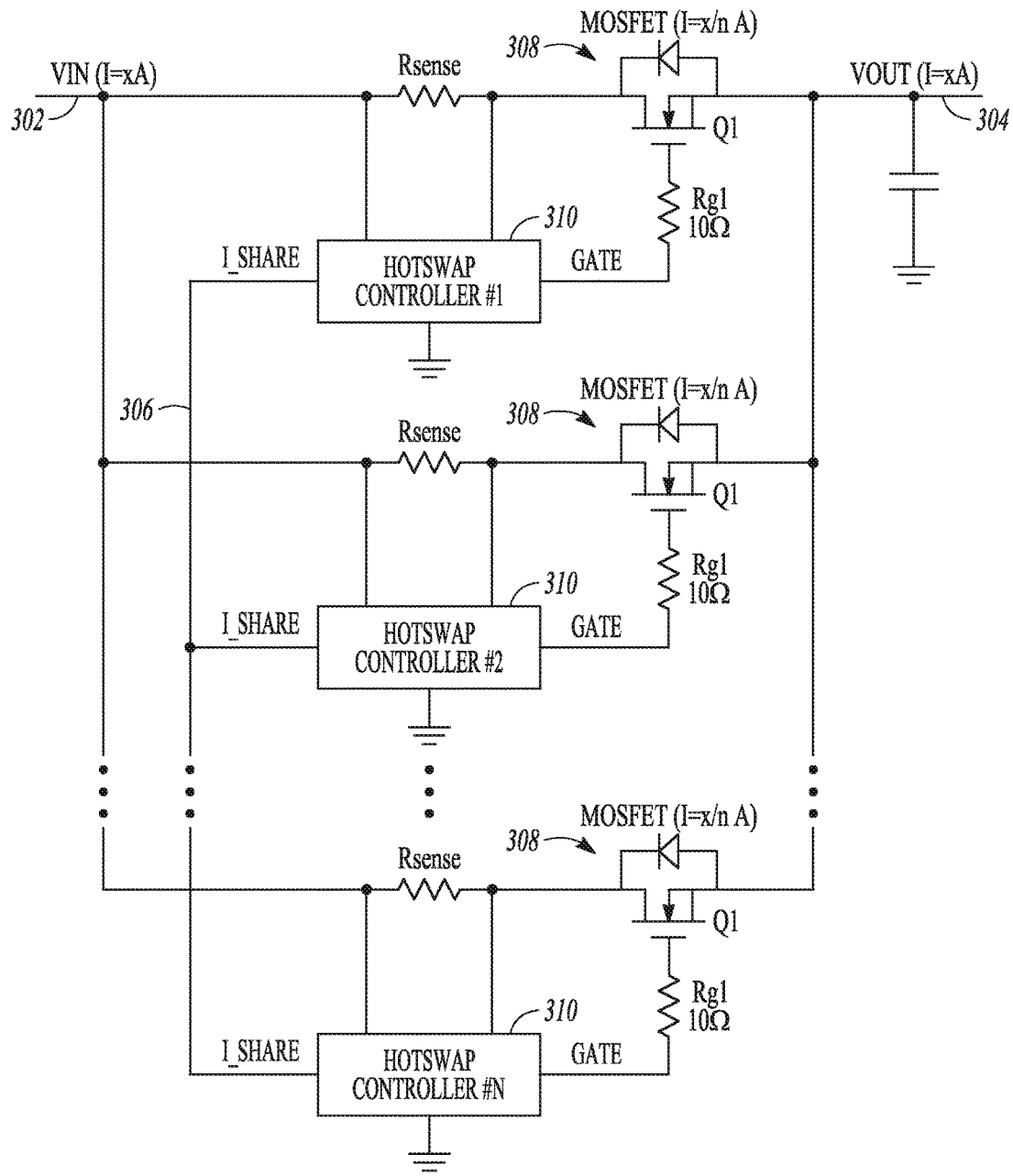
FIG. 7 is an illustrative drawing of an alternative hot-swap system in accordance with some embodiments.

FIG. 7 is an illustrative drawing of an alternative hot-swap system in accordance with some embodiments. During hot swap, an input voltage $V_{IN}$ provided on an input node 302, charges an output voltage provided on an output node 304. A charging voltage and current are provided across FET circuitry. A FET's safe operating area (SOA) limit can be quantified in terms of power and time. The voltages and currents involved in hot swap, e.g., 12V, 33 A, can be far too high to safely use a single FET due to SOA limits. A solution can be to divide the current among multiple FETs in parallel so as to lower the IV exposure of each FET so as to keep it within its SOA. A problem with multiple FETs in parallel may be that each may have a slightly different $V_T$, resulting in some turning on sooner than others, and therefore, being at risk of SOA failure during the time frame when they are on and the others are off.

FIG. 7 is an illustrative drawing showing a shared current bus 306 used to divide the current among multiple FETs 308 and individual hot-swap controllers 310, one per FET, to regulate the voltage and current through the FETs. Each FET 308 can be coupled in series with an $R_{sense}$ resistor, and each FET 308 and its corresponding $R_{sense}$ resistor can be coupled between the $V_{in}$ node 302 and the output node 304. The controllers 310 can use the $R_{sense}$ resistors to measure load across corresponding FETs 308. An objective can be to achieve appropriate power dissipation per FET for a given time so as to remain within a safe SOA. For each FET connected in parallel, as the output node 304 charges, voltage across the FET can decrease, which means that current can increase to maintain a fixed power across that FET. It is the role of each of the individual controllers 310 to maintain the safe operating area per FET 308.

The multiple individual hot-swap controllers 310 can have a common current share bus connection 312 to utilize the SOA of two or more of the MOSFETs 308 in the system to achieve a more robust and efficient use of the MOSFETs for powerup and fault protection. A common shared bus can be employed to distribute a common signal, analog or digital. This signal can allow each controller 310 to regulate the load current to the appropriate level to ensure that the current is equally shared between each current path. Thus, the total power that would be traditionally dissipated in a single MOSFET can be shared across the other parallel MOSFETs 308. This sharing can reduce the SOA specification required of each MOSFET 308.

Figure 8:
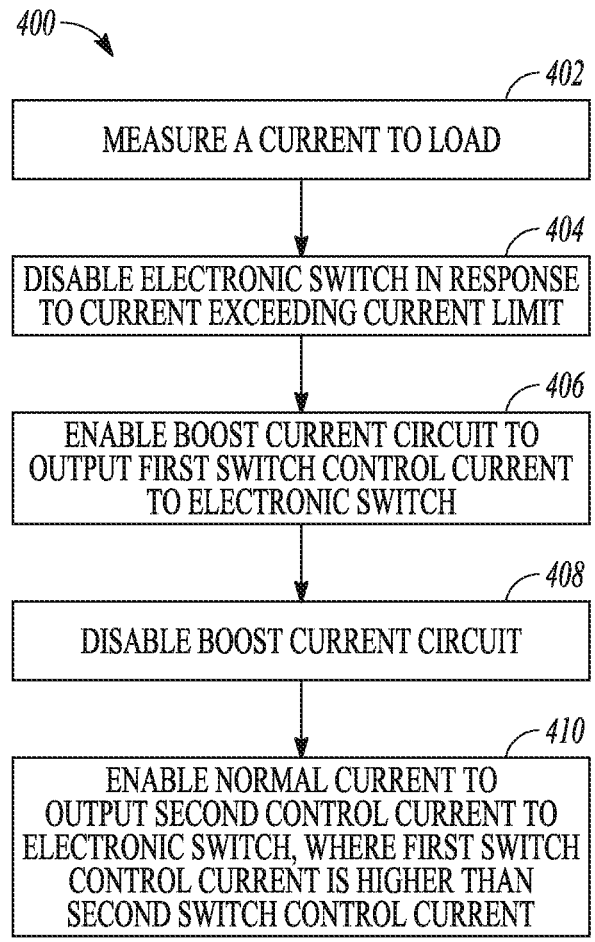
FIG. 8 is a flow diagram of an example of a method for managing power line disturbances and faults, in accordance with this disclosure.

FIG. 8 is a flow diagram of an example of a method for controlling an electronic switch between a power supply and a load, in accordance with this disclosure. In the method 400 shown in FIG. 8, a hot swap controller, e.g., hot swap controller 32 of FIG. 3, can measure a current to the load using a current sensing circuit, e.g., sensing circuit 42 of FIG. 3 (block 402). The hot swap controller can include a control circuit in communication with the sensing circuit and the electronic switch, e.g., the control circuit 54 of FIG. 3.

The control circuit can be configured to control operation of the electronic switch, e.g., electronic switch 36 of FIG. 3, if the current exceeds a current limit. The control circuit can include a normal current circuit configured to output a first switch control current to the electronic switch, e.g., normal current circuit 62 of FIG. 3, and a boost current circuit configured to output a second switch control current to the electronic switch, e.g., boost current circuit 66 of FIG. 3, where the first switch control current is higher than the second switch control current.

In response to the current exceeding a current limit, the method 400 can include disabling, e.g., using the control circuit 54 of FIG. 3, the electronic switch (block 404). At block 406, the method 400 can include enabling a boost current circuit to output a first switch control current to the electronic switch, e.g., FET. The control circuit can disable the boost current circuit (block 408) and enable the normal current circuit to output the second switch control current to the electronic switch (block 410).

In some examples, the control circuit can disable the boost current circuit and enable the normal current circuit to output the second switch control current to the electronic switch in response to at least one of detecting the current, detecting a voltage exceeding a preset voltage, and determining that a time exceeded a preset time.

In some optional implementations, the control circuit can control a switch, e.g., switch S4 of FIG. 3, to position the switch in a first position to connect one or more components, e.g., dV/dt capacitor 76 of FIG. 3, to a first device pin, e.g., a gate terminal of the FET, and control the third switch to position the third switch in a second position to connect the one or more components to a second device pin, e.g., VOUT, where the one or more components can include a capacitance configured to set a voltage ramp time at the electronic switch.

In some example implementations, various techniques described with respect to FIGS. 3, 5, 6, and 8 can be combined. As mentioned above with respect to FIG. 4, Stage 4 can include running at the current limit while VOUT is recovering. A solution can include using the scheme described with respect to FIG. 5, which allows the on-time to be dynamically controlled and defined by the MOSFET Vds of the live system. A component network can be placed on this pin to allow the voltage on this pin to model the MOSFET junction temperature. So with a low VDS fault, if the SOA dictates, the on-time can be significantly longer than if the VDS was very high.

Therefore, the method of FIG. 8 can optionally include techniques for protecting the electronic switch from exceeding its safe operating area (SOA). The control circuit can control a sourcing of a current representing a voltage across the electronic switch into one of a first device pin of a device and a second device pin of the device based on whether the device is in a first operating mode or a second operating mode, wherein the first operating mode has a first constant current level through the electronic switch and the second operating mode has a second constant current level through the electronic switch, where the first device pin is configured to be connected to at least one first component, where the at least one first component is a model of a first region of the SOA of the electronic switch, and where the second device pin is configured to be connected to at least one second component, wherein the at least one second component is a model of a second region of the SOA of the electronic switch; receiving an SOA breach signal if a voltage on either the first device pin or the second device pin exceeds a threshold voltage. The control circuit can output a signal to the control circuit to turn off the electronic switch in response to receiving the SOA breach signal.

It should be noted that the techniques described above are not limited to controlling a single electronic switch, e.g., FET, but can be used for controlling more than one electronic switch, e.g., two or more FETs. By way of a specific, non-limiting example, three FETs can be configured such that their 3 drains are connected together, their 3 sources are connected together, and each of the 3 gates can each be connected to a respective resistor that are then connected to a hot swap controller, e.g., hot swap controller 32 of FIG. 3.

Various Examples and Notes

Example 1 includes subject matter (such as a device, circuit, apparatus, or machine) for controlling an electronic switch between a power supply and a load, the device comprising: a first device pin configured to be connected to the electronic switch; a sensing circuit configured to measure a current to the load; a control circuit in communication with the sensing circuit and the electronic switch, the control circuit configured to control operation of the electronic switch if the current exceeds a current limit, the control circuit including: a normal current circuit configured to output a first switch control current to the electronic switch; a boost current circuit configured to output a second switch control current to the electronic switch, the first switch control current being higher than the second switch control current; wherein the control circuit is configured to, after disabling the electronic switch in response to the current exceeding the current limit: enable the boost current circuit to output the second switch control current to the electronic switch; and wherein the control circuit is configured to, after enabling the boost current circuit: disable the boost current circuit; and enable the normal current circuit to output the first switch control current to the electronic switch.

In Example 2, the subject matter of Example 1 may optionally include a first switch configured to connect the boost current circuit to the first device pin; a second switch configured to connect the normal current circuit to the first device pin, wherein the control circuit is configured to, after disabling the electronic switch in response to the current exceeding the current limit: output at least one first signal to control the first switch to connect the boost current circuit to the first device pin and to control the second switch to disconnect the normal current circuit from the first device pin; and wherein the control circuit is configured to, after enabling the boost current circuit: output at least one second signal to control the first switch to open and to control the second switch to close.

In Example 3, the subject matter of one or more of Examples 1 to 2 may optionally include, wherein the electronic switch includes a plurality of electronic switches.

In Example 4, the subject matter of one or more of Examples 1 to 3 may optionally include, a third switch having a first position and a second position, the third switch configured to be connected to at least one first component, wherein the at least one first component includes a capacitance configured to set a voltage ramp time at the electronic switch, wherein the control circuit is configured to position the third switch in the first position to connect the at least one first component to the first device pin, and wherein the control circuit is configured to position the third switch in the second position to connect the at least one first component to the second device pin.

In Example 5, the subject matter of one or more of Examples 1 to 4 may optionally include, wherein the boost current circuit includes a linear voltage ramp generator circuit.

In Example 6, the subject matter of any one or more of Examples 1 to 5 may optionally include, wherein the electronic switch is a field-effect transistor (FET).

In Example 7, the subject matter of one or more of Examples 1 to 6 may optionally include, wherein the first device pin configured to be connected to the electronic switch is configured to be connected to a gate of the FET.

In Example 8, the subject matter of one or more of Examples 1 to 7 may optionally include, wherein the device has a first operating mode and a second operating mode, the device comprising: a third device pin configured to be connected to at least one second component, where the at least one second component is a model of a first region of a safe operating area (SOA) of the electronic switch; a fourth device pin configured to be connected to at least one third component, wherein the at least one third component is a model of a second region of the SOA of the electronic switch; and an SOA protection circuit configured to: turn off the electronic switch in response to a breach of the first SOA region when in the first operating mode and in response to a breach of the second SOA region when in the second operating mode.

In Example 9, the subject matter of one or more of Examples 1 to 8 may optionally include, a fifth device pin configured to be connected to at least one fourth component, wherein the at least one fourth component includes a capacitance configured to supply the second switch control current to the electronic switch.

In Example 10, the subject matter of one or more of Examples 1 to 9 may optionally include, wherein disabling the boost current circuit and enabling the normal current circuit to output the first switch control current to the electronic switch is in response to at least one of detecting the current, detecting a voltage exceeding a preset voltage, and determining that a time exceeded a preset time.

Example 11 includes subject matter (such as a method, means for performing acts, machine readable medium including instructions that when performed by a machine cause the machine to performs acts, or an apparatus configured to perform) for controlling an electronic switch between a power supply and a load, the method comprising: measuring a current to the load; disabling the electronic switch in response to a current exceeding a current limit; enabling a boost current circuit to output a first switch control current to the electronic switch; disabling the boost current circuit; and enabling a normal current circuit to output a second switch control current to the electronic switch, wherein the first switch control current is higher than the second switch control current.

In Example 12, the subject matter of Example 11 may optionally include, wherein enabling a boost current circuit to output a first switch control current to the electronic switch includes controlling a first switch to connect the boost current circuit to a first device pin of the electronic switch; and wherein enabling a normal current circuit to output a second switch control current to the electronic switch includes controlling a second switch to connect the normal current circuit to the first device pin.

In Example 13, the subject matter of one or more of Examples 11 and 12 may optionally include, wherein the electronic switch includes a plurality of electronic switches.

In Example 14, the subject matter of one or more of Examples 11 to 13 may optionally include, controlling a third switch to position the third switch in a first position to connect at least one first component to a first device pin; and controlling the third switch to position the third switch in a second position to connect the at least one first component to a second device pin, wherein the at least one first component includes a capacitance configured to set a voltage ramp time at the electronic switch.

In Example 15, the subject matter of one or more of Examples 11 to 14 may optionally include, wherein enabling a boost current circuit to output a first switch control current to the electronic switch includes enabling a linear voltage ramp generator circuit.

In Example 16, the subject matter of any one or more of Examples 11 to 15 may optionally include, wherein the electronic switch is a field-effect transistor (FET).

In Example 17, the subject matter of one or more of Examples 11 to 16 may optionally include, wherein enabling a boost current circuit to output a first switch control current to the electronic switch includes enabling a boost current circuit to output a first switch control current to a gate of the FET.

In Example 18, the subject matter of one or more of Examples 11 to 17 may optionally include, controlling a third device pin to be connected to at least one second component, where the at least one second component is a model of a first region of safe operating area (SOA) of the electronic switch; controlling a fourth device pin to be connected to at least one third component, wherein the at least one third component is a model of a second region of the SOA of the electronic switch; and an SOA protection circuit configured to: turn off the electronic switch in response to a breach of the first SOA region when in the first operating mode and in response to a breach of the second SOA region when in the second operating mode.

In Example 19, the subject matter of one or more of Examples 11 to 18 may optionally include, controlling a fifth device pin to be connected to at least one fourth component, wherein the at least one fourth component includes a capacitance configured to supply the second switch control current to the electronic switch.

In Example 20, the subject matter of one or more of Examples 11 to 19 may optionally include, wherein disabling the boost current circuit and enabling the normal current circuit to output the first switch control current to the electronic switch is in response to at least one of detecting the current, detecting a voltage exceeding a preset voltage, and determining that a time exceeded a preset time.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A device configured to automatically adjust a switch control current to control an electronic switch between a power supply and a load, the device comprising:
 a control circuit configured to control operation of the electronic switch when the control circuit determines that a current to the load exceeds a current limit, the control circuit including:
  a normal current circuit configured to output a first switch control current to the electronic switch; and
  a boost current circuit configured to output a second switch control current to the electronic switch initially after the electronic switch is disabled in response to the current exceeding the current limit, the second switch control current being higher than the first switch control current.

2. The device of claim 1,
wherein the control circuit is configured to, after the electronic switch is disabled in response to the current exceeding the current limit:
control a first switch to connect the boost current circuit to a first device pin and to control a second switch to disconnect the normal current circuit from the first device pin; and
wherein the control circuit is configured to, after the boost current circuit is enabled:
control the first switch to open and to control the second switch to close.

3. The device of claim 1, wherein the electronic switch includes a plurality of electronic switches.

4. The device of claim 1, comprising:
a third switch configured to be connected to at least one first component, wherein the at least one first component includes a capacitance configured to set a voltage ramp time at the electronic switch.

5. The device of claim 1, wherein the boost current circuit includes a linear voltage ramp generator circuit.

6. The device of claim 1, wherein the electronic switch is a field-effect transistor (FET).

7. The device of claim 6, further comprising:
a first device pin configured to connect the output of the normal current circuit and the output of the boost current circuit to a gate of the FET.

8. The device of claim 1, wherein the device has a first operating mode and a second operating mode, the device comprising:
a third device pin configured to be connected to at least one second component, where the at least one second component is a model of a first region of a safe operating area (SOA) of the electronic switch;
a fourth device pin configured to be connected to at least one third component, wherein the at least one third component is a model of a second region of the SOA of the electronic switch; and
an SOA protection circuit configured to:
disable the electronic switch in response to a breach of the first SOA region when in the first operating mode and in response to a breach of the second SOA region when in the second operating mode.

9. The device of claim 1, comprising:
a fifth device pin configured to be connected to at least one fourth component, wherein the at least one fourth component includes a capacitance configured to supply the second switch control current to the electronic switch.

10. The device of claim 1, wherein the normal current circuit is configured to output the first switch control current to the electronic switch in response to one or more of detecting the current, detecting a voltage exceeding a preset voltage, and determining that a time exceeded a preset time.

11. A method for automatically adjusting a switch control current to control an electronic switch between a power supply and a load, the method comprising:
measuring a current to the load;
disabling the electronic switch in response to a current exceeding a current limit;
enabling a boost current circuit to output a first switch control current to the electronic switch;
disabling the boost current circuit; and
enabling a normal current circuit to output a second switch control current to the electronic switch,
wherein the first switch control current is higher than the second switch control current.

12. The method of claim 11,
wherein enabling a boost current circuit to output a first switch control current to the electronic switch includes controlling a first switch to connect the boost current circuit to a first device pin of the electronic switch; and
wherein enabling a normal current circuit to output a second switch control current to the electronic switch includes controlling a second switch to connect the normal current circuit to the first device pin.

13. The method of claim 11, wherein the electronic switch includes a plurality of electronic switches.

14. The method of claim 11, comprising:
controlling a third switch to connect at least one first component to a first device pin, the first device pin configured to be connected to the electronic switch,
wherein the at least one first component includes a capacitance configured to set a voltage ramp time at the electronic switch.

15. The method of claim 11, wherein enabling a boost current circuit to output a first switch control current to the electronic switch includes enabling a linear voltage ramp generator circuit.

16. The method of claim 11, wherein the electronic switch is a field-effect transistor (FET).

17. The method of claim 16, wherein enabling a boost current circuit to output a first switch control current to the electronic switch includes enabling a boost current circuit to output a first switch control current to a gate of the FET.

18. The method of claim 11, comprising:
disabling the electronic switch in response to a breach of a first safe operating area (SOA) region when in a first operating mode and in response to a breach of a second SOA region when in a second operating mode.

19. The method of claim 11, comprising:
coupling the boost current circuit to a capacitance configured to supply the second switch control current to the electronic switch.

20. The method of claim 11, wherein disabling the boost current circuit and enabling the normal current circuit to output the first switch control current to the electronic switch is in response to one or more of detecting the current, detecting a voltage exceeding a preset voltage, and determining that a time exceeded a preset time.

21. A device configured to automatically adjust a switch control current to control an electronic switch between a power supply and a load, the device comprising:
means for measuring a current to the load;
means for disabling the electronic switch in response to a current exceeding a current limit;
means for enabling a boost current circuit to output a first switch control current to the electronic switch;
means for disabling the boost current circuit; and
means for enabling a normal current circuit to output a second switch control current to the electronic switch,
wherein the first switch control current is higher than the second switch control current.

22. The device of claim 21, wherein the device has a first operating mode and a second operating mode, the device comprising:
means for disabling the electronic switch in response to a breach of a first safe operating area (SOA) region when in the first operating mode and in response to a breach of the second SOA region when in the second operating mode.

* * * * *